(12) United States Patent
Bakalski et al.

(10) Patent No.: US 7,936,045 B2
(45) Date of Patent: May 3, 2011

(54) INTEGRATED CIRCUIT WITH MULTI-STAGE MATCHING CIRCUIT

(75) Inventors: Winfried Bakalski, Munich (DE); Krzysztof Kitlinski, Munich (DE); Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 607 days.

(21) Appl. No.: 11/761,087

(22) Filed: Jun. 11, 2007

(65) Prior Publication Data

US 2008/0303117 A1 Dec. 11, 2008

(51) Int. Cl.
*H01L 29/92* (2006.01)
*H01L 23/36* (2006.01)
(52) U.S. Cl. ........ 257/531; 257/532; 257/621; 257/276; 257/E23.102; 257/E21.008; 438/393
(58) Field of Classification Search ............ 257/531, 257/532, 621, 276, E23.102, E21.008; 438/393
See application file for complete search history.

(56) References Cited

U.S. PATENT DOCUMENTS

| 5,774,017 | A  | * | 6/1998  | Adar ............................ 330/51 |
| 6,437,649 | B2 | * | 8/2002  | Miyashita et al. ............ 330/302 |
| 7,276,420 | B2 | * | 10/2007 | Liu et al. ..................... 438/329 |
| 7,305,223 | B2 | * | 12/2007 | Liu et al. ..................... 455/333 |
| 2003/0052748 | A1 | * | 3/2003 | Kariya et al. ................. 333/185 |
| 2004/0232519 | A1 | * | 11/2004 | Van Beek et al. ............. 257/531 |
| 2007/0007622 | A1 |   | 1/2007  | Liu et al. |

FOREIGN PATENT DOCUMENTS

WO  2006071371 A2  7/2006

OTHER PUBLICATIONS

"Shielded Passive Devices for Silicon-Based Monolithic Microwave and Millimeter-Wave Integrated Circuits", Tak Shun Dickson Cheung and John R. Long, IEEE Journal of Solid-State Circuits, vol. 41, No. 5, May 2006, pp. 1183-1200.

* cited by examiner

*Primary Examiner* — Ngan Ngo
*Assistant Examiner* — Benjamin Tzu-Hung Liu
(74) *Attorney, Agent, or Firm* — Eschweiler & Associates, LLC (57) ABSTRACT

An integrated circuit with a multi-stage matching circuit with an inductive conductive structure with a first end and a second end in the integrated circuit and a capacitor structure in the integrated circuit connected to a tap between the ends of the inductive conductive structure between the inductive conductive structure and a reference potential.

18 Claims, 10 Drawing Sheets

FIG 3
without MIM Cap

FIG 5
with MIM Cap

INTEGRATED CIRCUIT WITH MULTI-STAGE MATCHING CIRCUIT

TECHNICAL FIELD

The present invention relates to integrated circuits, in particular, to integrated circuits for impedance matching, as they may be employed, for example, for a power matching of two radio frequency circuit blocks.

BACKGROUND

Impedance matching means matching a source impedance with a load impedance, so that power transported from a generator to a load is rendered maximum. A load impedance is often not matched with a line, which, in the case of radio frequency circuits, results in standing waves on the line, whereby the power may not be fully transferred from the generator to the load. On a line with a wave completely standing, for example, there can be no energy transportation. This effect may typically be prevented by two types of matching. First, loads may be matched resistively by means of resistors. This, however, incurs high loses and is basically only used when a certain impedance must be retained over very many parameters. This is often referred to as a so-called forced matching. A frequency-dependent method is represented by a use of reactances, wherein here too, depending on the quality of the reactances, losses are incurred, even if they are typically substantially smaller.

Matching circuits are often realized by means of discrete devices, which leads to substantial space requirements. Therefore, matching circuits, in particular integrated matching circuits, keeping the chip area required for the matching circuits as small as possible, are desired.

SUMMARY OF THE INVENTION

According to embodiments, the present invention provides an integrated circuit with a multi-stage matching circuit with an inductive conductive structure having a first end and a second end in the integrated circuit and a capacitor structure in the integrated circuit connected to a tap between the ends of the inductive conductive structure between the inductive conductive structure and a reference potential.

BRIEF DESCRIPTION OF THE DRAWINGS

Embodiments of the present invention will be detailed subsequently referring to the appended drawings, in which:

FIG. 2b is an equivalent circuit diagram of the assembly shown in FIG. 2a;

FIG. 4b in an equivalent circuit diagram of the assembly shown in FIG. 4a;

FIG. 6a is a top view of an inductive conductive structure would up to form a planar coil with capacitor structures formed below the conductive structure according to an embodiment of the present invention;

FIG. 6b is a perspective representation of the assembly shown in FIG. 6a;

FIG. 9b is an equivalent circuit diagram of the assembly shown in FIG. 9a; and

DETAILED DESCRIPTION OF THE INVENTION

Referring to the following description, it must be noted that in the various embodiments, like functional elements or functional elements having the same effect have the same reference numerals and, therefore, the description of these functional elements are interchangeable in the various embodiments represented in the following.

Figure 1:
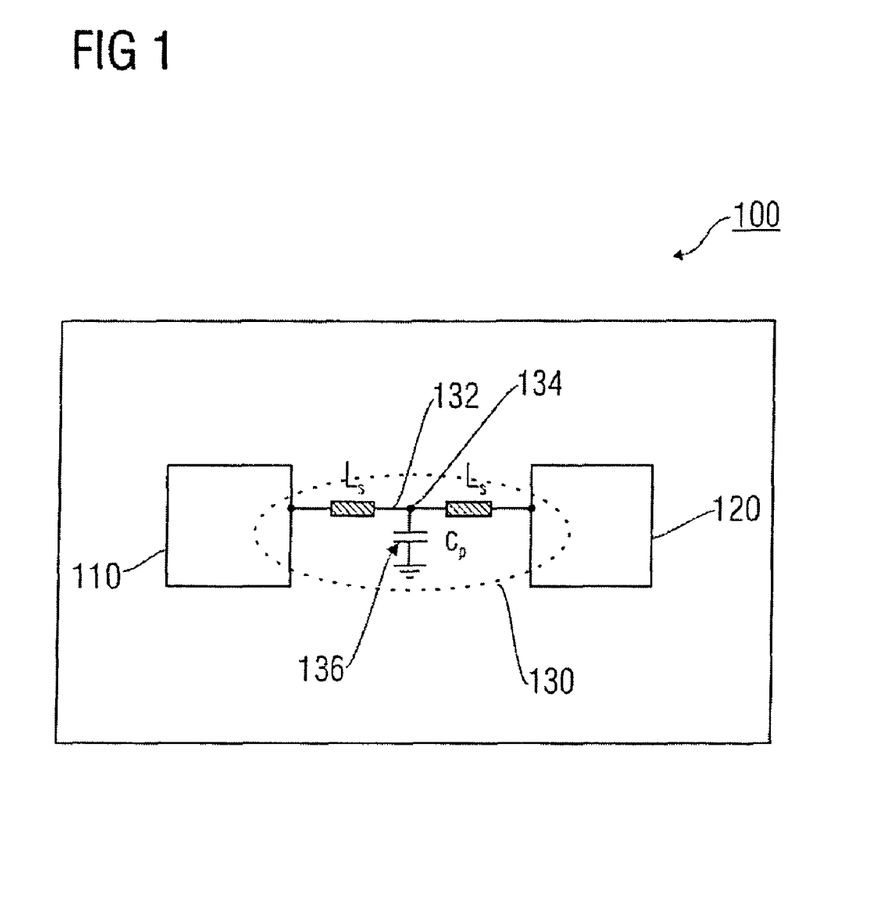
FIG. 1 is a schematic representation of an integrated circuit with a multi-stage matching circuit between circuit blocks according to an embodiment of the present invention.

FIG. 1 shows a schematic representation of an integrated circuit 100 according to an embodiment of the present invention.

The integrated circuit 100 comprises a first circuit block 110 and a second circuit block 120. Between the two circuit blocks, a multi-stage matching circuit 130 with an inductive conductive structure 132 is located, a first end of which being connected to the first circuit block 110 and a second line end of which being connected to the second circuit block 120. At a tap 134 between the two ends of the inductive conductive structure 132, a capacitor structure 136 is connected between the inductive conductive structure 132 and a reference potential.

In the matching circuit 130 exemplarily and schematically shown in FIG. 1, inductances $L_S$ are formed on both sides of the tap 134 by means of a distributed inductance of the conductive structure 132. In order to achieve high quality of the inductive conductive structure 132, copper metallization and highly-insulating substances may for example be used in the integrated circuit 100.

Figure 9A:
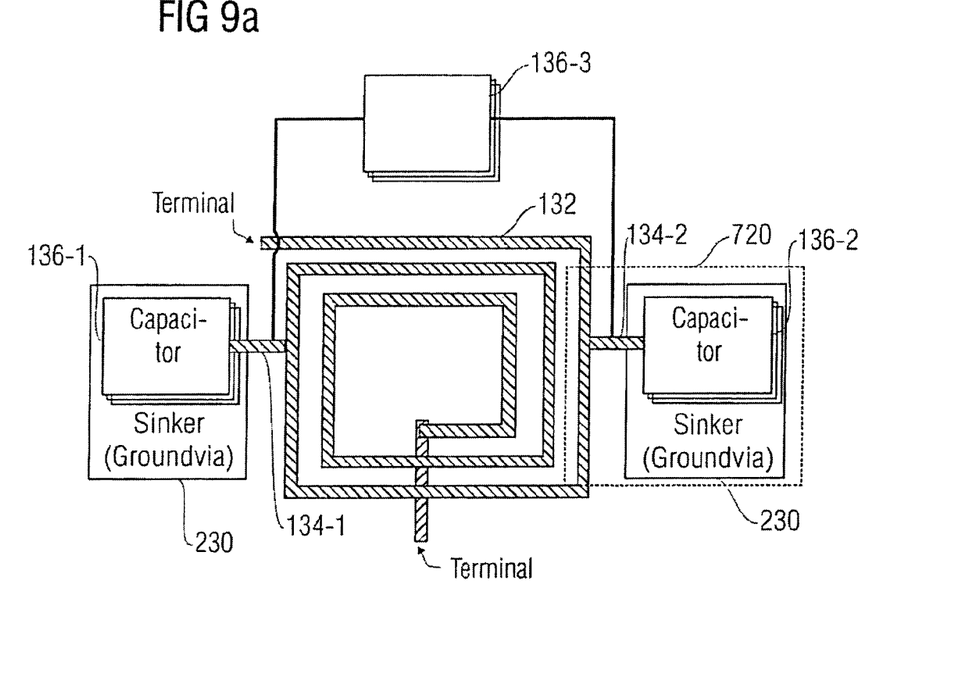
FIG. 9a is an inductive conductive structure wound up to dorm a planar coil with capacitor structures formed outside the planar coil and connected thereto according to a further embodiment of the present invention.

A matching circuit 130 according to embodiments of the present invention may, for example, be used for an output matching of power output stages in order to be able to simultaneously attenuate harmonic output products, which will later be discussed in greater detail with respect to FIG. 9.

In embodiments of the present invention, capacitor structures 136 are connected between the inductive conductive structure 132 and the reference potential, which may for example be a ground potential, at regular intervals by means of the taps 134. Thereby, power-matching may be effected in several sub-steps. If these sub-steps are expertly chosen, they are subject to reduce quality requirements. in addition, a bandwidth of the matching circuit 130 may be increased as the frequency-dependent reactances decrease.

In embodiments of the present invention, the inductive conductive structure 132 is patterned in a topmost metallization plane of a layer stack of the integrated circuit 100. In embodiments of the present invention, the capacitor structure 136 or a plurality of capacitor structures 136 are specifically inserted into the inductive conductive structure 132 and the reference potential. This is to say that, for example, capacitances are specifically installed below the topmost metallization plane, in which the inductive conductive structure 132 is patterned. The capacitor structures may be of different designs. Current capacitor structures for integrated circuits are so-called MIM capacitors (MIM=Metal Insulator Metal), MIS capacitors (MIS=Metal Insulator Semiconductor) or, for example, trench capacitors (for example, SIL-Cap).

According to embodiments of the present invention, a first electrode of a capacitor structure 136 is formed by a predefined area of the inductive conductive structure 132 in a topmost metallization plane of a layer stack of the integrated circuit 100.

In the following, embodiments of integrated circuits will be discussed in closer detail with respect to FIGS. 2 to 9.

Figure 2A:
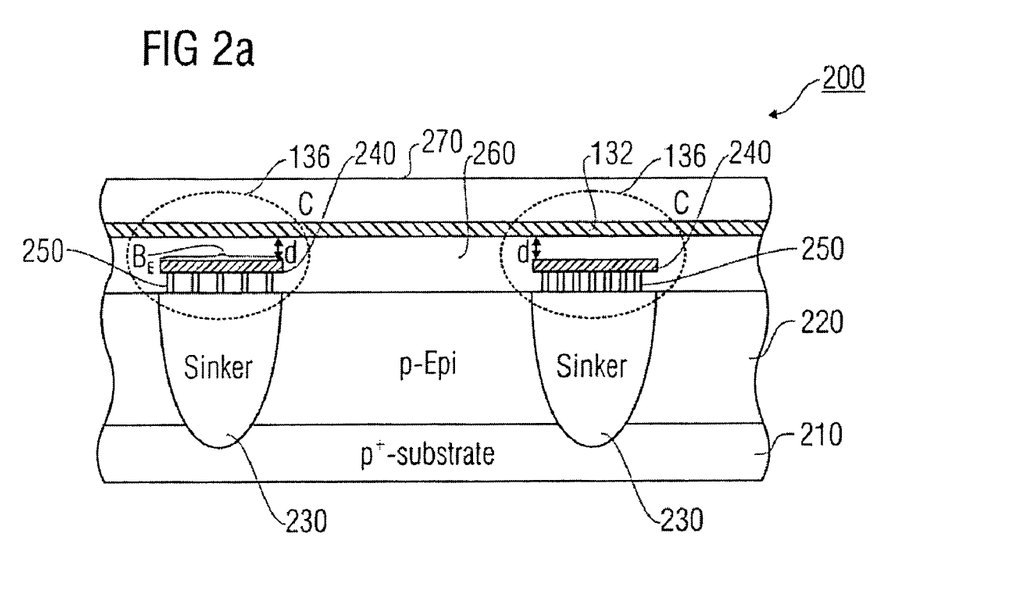
FIG. 2a is a schematic sectional view of an inductive conductive structure applied to a semiconductor substrate with capacitor structures introduced into two semiconductor substrate according to an embodiment of the present invention.

A sector 200 of a multi-stage matching circuit with an inductive conductive structure and two capacitor structures is shown in a sectional view in FIG. 2a.

The integrated matching circuit comprises a substrate 210 of, for example, a highly p-doped material. An epitaxy layer 220 is deposited on the substrate 210 in a conventional manner. Here, the epitaxy layer typically consists of p-doped material. Low-resistance p-sinker areas 230, for example, are introduced into the epitaxy layer 220 by means of typical silicon process steps, so that the p-sinker areas 230 electrically contact the $p^+$-substrate 210, Above the sinker areas 230, there are metallic electrodes 240, which are connected to the respective sinker areas 230 by means of vias 250. The electrodes 240 and the vias 250 are embedded in a dielectric layer 260, onto which an inductive conductive structure 132 is patterned in a topmost metallization layer. Typically, on top of the topmost metallization layer, in which the inductive conductive structure 132 is formed, there is also a passivation layer 270.

In the embodiment of the present invention shown in FIG. 2a, a capacitance and/or a capacitor structure 136 is formed by a respective sinker area 230, the respective overlying metallic electrode 240 and one respective predefined area of the inductive conductive structure 132 above the metal electrode 240, as is indicated in FIG. 2a. According to embodiments of the present invention, a ratio of a smallest dimension of opposing areas of the electrodes 240, 132 of the capacitor structure 136 to a distance d between the opposing electrodes 240, 132 is greater than 50. Here, the smallest dimension of opposing sides and/or areas of the electrodes may for example be given by a width $B_E$ of the electrode 240 or by a width $B_L$ of the inductive conductive structure 132.

Alternatively, the sinker area 230 may also be replaced by substrate vias (VIA=Vertical Interconnect Access).

Furthermore, the metallic electrodes 240 and the vias 250 shown in FIG. 2a may also be omitted, so that a capacitor structure 136 is formed by a sinker area 230, the insulation layer 260 and the overlying conductive structure 132. In that case, the capacitor structure 136 would be the matter of an MIS capacitor structure. Distance d would then be the distance of the sinker structure 230 to the conductive structure 132. Typically, there will then also be a buried layer underneath the sinker areas 230, which will be necessitated in the production of npn transistors.

In embodiments of the present invention, the electrodes 240 have dimensions of approximately 100 μm×100 μm. In embodiments, the distance d between the electrodes 240 and the inductive conductive structure 132 is in a range of 30 nm to 100 nm, while a dielectric may be used between the electrodes for a further capacitance increase.

Figure 2B:
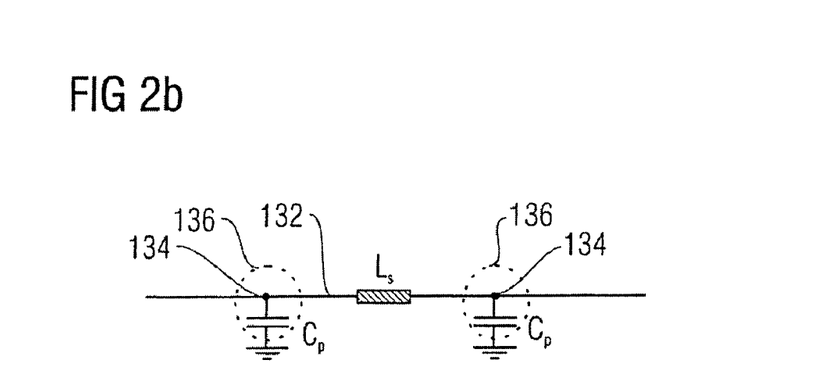

In FIG. 2b is shown the equivalent circuit diagram of the sector 200 of a multi-stage matching circuit shown in FIG. 2a.

The stretch of the conductive structure 132 running between the two capacitor structures 136 forms an inductance $L_S$ by means of its distributed inductance. Thus, multi-stage matching circuits may be realized in the integrated circuits by means of suitable dimensioning of the capacitances $C_P$ of the capacitor structures 136 and the distances between the taps 134.

Figure 3:
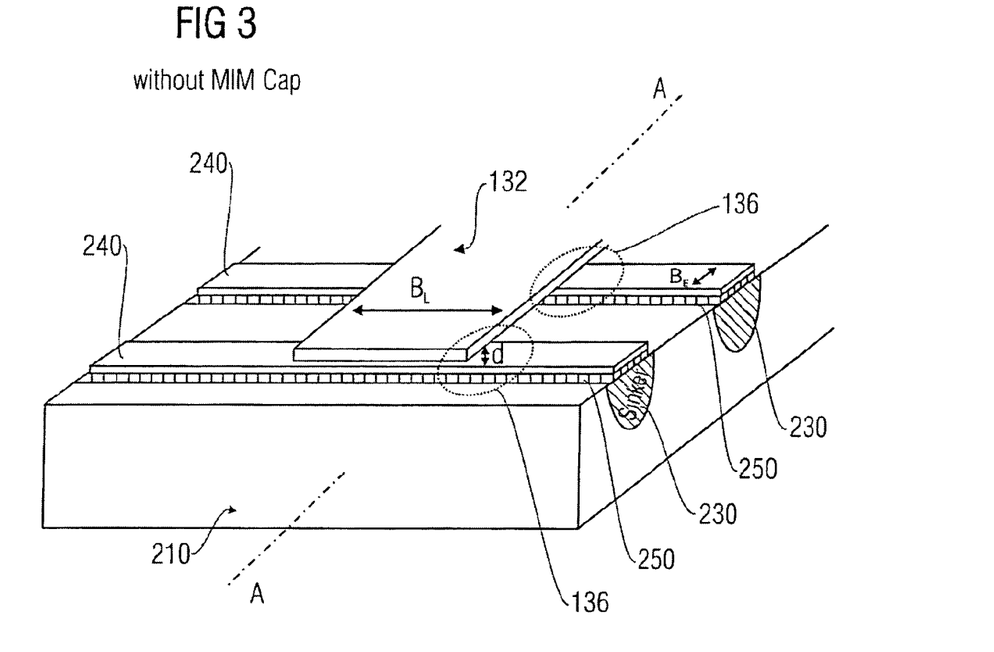
FIG. 3 is a perspective view of the inductive conductive structure with the capacitor structures shown in FIG. 2.

A perspective view of the section shown in FIG. 2a is again represented in FIG. 3 for better illustration.

It is to be understood once again here, that by the periodically intermittent arrangement of the sinker areas 230 below the inductive conductive structure 132, a periodical interruption of a reference potential plane is achieved, and capacitor structures may specifically be formed between the inductive conductive structure 132 and the sinker areas 230. Thus, matching circuits may be advantageously realized between circuit blocks of an integrated circuit.

Figure 4A:
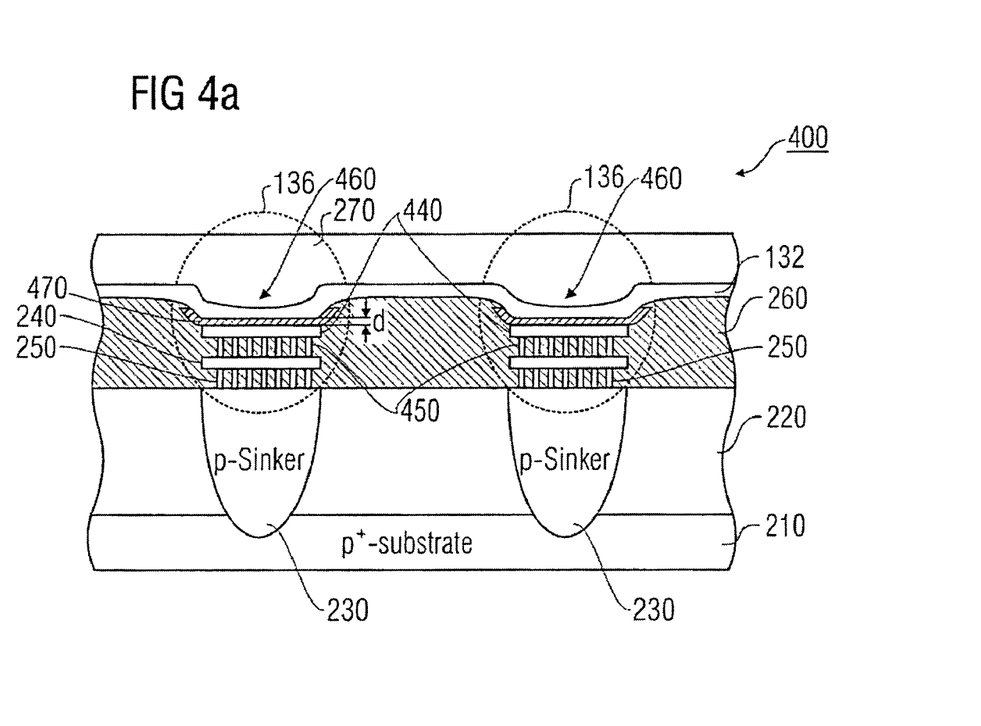
FIG. 4a is a schematic sectional view of an inductive conductive structure applied to a semiconductor substrate with capacitor structures introduced into the semiconductor substrate according to a further embodiment of the present invention.

A further embodiment of an integrated multi-stage matching circuit is shown in a cross-sectional view of FIG. 4a.

The section 400 of a matching circuit shown in FIG. 4a differs from the matching circuit shown in FIG. 2a by the use of MIM capacitor structures between the conductive structure 132 and the sinker areas 230.

Underneath, the top metallization layer comprising the conductive structure 132, there is a second metal sheet, in which electrodes 440 are patterned. By means of vias 450, the electrodes 440 are connected to first or undermost metallization planes, which are in turn each connected to the p-sinker areas 230 by means of the vias 250.

In the embodiment shown in FIG. 4a, the metal of the topmost metallization layer, in which the conductive structure 132 is patterned, is deposited above the electrodes into etchings 460. The thickness d of a dielectric layer 470 between the topmost metallization plane of the conductive structure 132 and the electrode 440 depends on a desired electric strength and is typically in a range of 30 nm to 100 nm, particularly in a range of 50 nm to 80 nm.

In embodiments of the present invention having an MIM capacitor structure, too, the ratio of the smallest dimension of opposing areas of the electrodes 440, 132 of the capacitor structures to a distance of the opposing electrodes is greater than 50. That is, while the electrodes 440 and the conductive structure 132 deposited into the etchings typically have dimensions of approximately 100 μm×100 μm, the distance d of the dielectric layer 470 between the topmost metallization plane of the conductive structure 132 and the electrode 440 is dependent on a desired electric strength and typically is in a range of 30 nm to 100 nm, particularly in a range of 50 nm to 80 nm. In embodiments, the dielectric 470 between the conductive structure 132 and the electrode 440 is a nitride.

Instead of depositing the metal of the topmost metallization plane of the conductive structure 132 into the etchings represented by FIG. 4a, it is also possible to introduce metallic contact areas between the metallization plane of the electrodes 440 and the topmost metallization plane of the conductive structure 132, in order to reduce the distance d of the two metallization planes to a range of 13 nm to 100 nm above the electrodes 440 only.

It is to be understood here, too, that the realization of the MIM capacitor structure 136 represented in FIG. 4a is only an example. other types of realizations, for example by omitting the undermost metallization plane for the metallic area 240, are also conceivable, for example by substituting tantalum nitride layers (in copper metallization in order to avoid impurities by Cu).

As opposed to the capacitor structures described with respect to FIG. 2a, and in particular as opposed to MIS capacitor structures, the MIM capacitor structures described with respect to FIG. 4a have substantially higher qualities. MIS capacitor structures are a type of MOS capacitor (MOS=Metal Oxide Semiconductor), that is only the upper plate or electrode is a metal, while the lower one is realized by a buried layer otherwise necessitated for transistors. MIS capacitor structures may be realized more cost-effectively, but are of inferior quality, as polysilicon is characterized by a lower sheet resistance. In addition, the capacitances of MIS capacitor structures are dependent on a voltage applied.

Figure 4B:
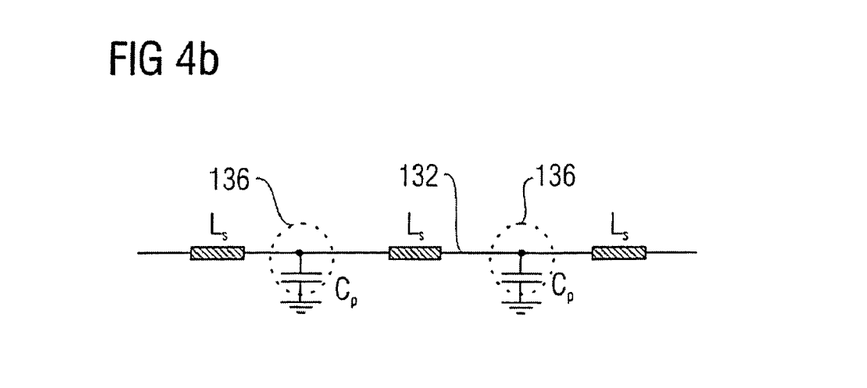

The equivalent circuit diagram for the matching circuit shown in FIG. 4a is shown in FIG. 4b and does not differ from the equivalent circuit diagram described in FIG. 2b as far as the structure is concerned.

Figure 5:
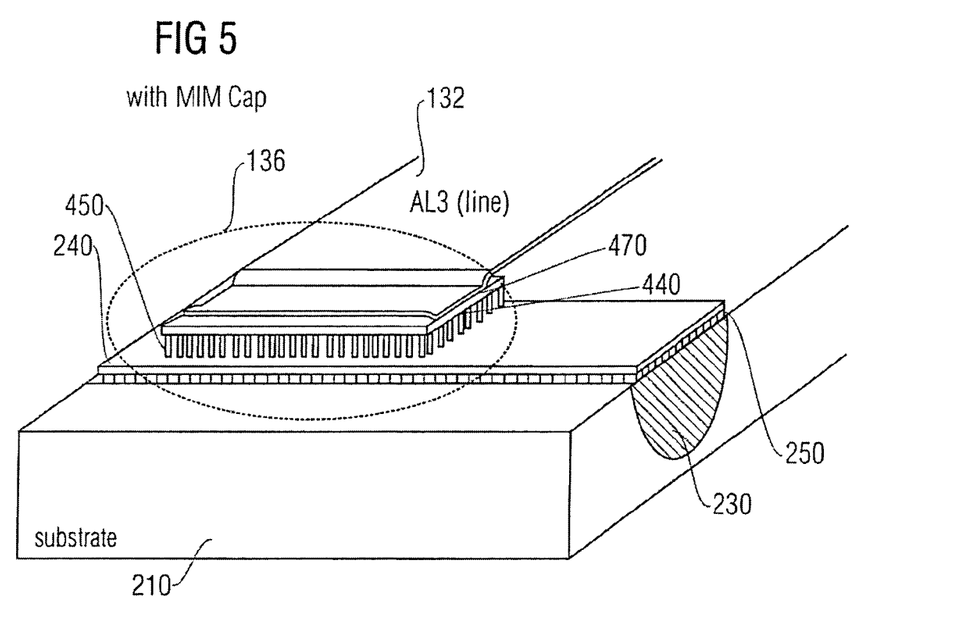
FIG. 5 is a perspective view of the inductive conductive structure with capacitor structures shown in FIG. 4.

A perspective representation of the section 400 is described in FIG. 4a of an integrated matching circuit with an inductive conductive structure 132 and an MIM capacitor structure 136 in the integrated matching circuit, which is connected to a tap of the inductive conductive structure 132 between the inductive conductive structure 132 and a reference potential, is shown in FIG. 5.

If an integrated multi-stage matching circuit according to embodiments is to be used for smaller frequencies, such as the 900 MHz GSM band, too, it will be necessary to increase the inductances $L_S$ between the individual capacitor structures 136. In order to achieve this, the inductive conductive structure 132 may be configured in the shape of a planar coil as it is exemplarily shown in the FIGS. 6a and 6b.

Figures 6A, 6B:
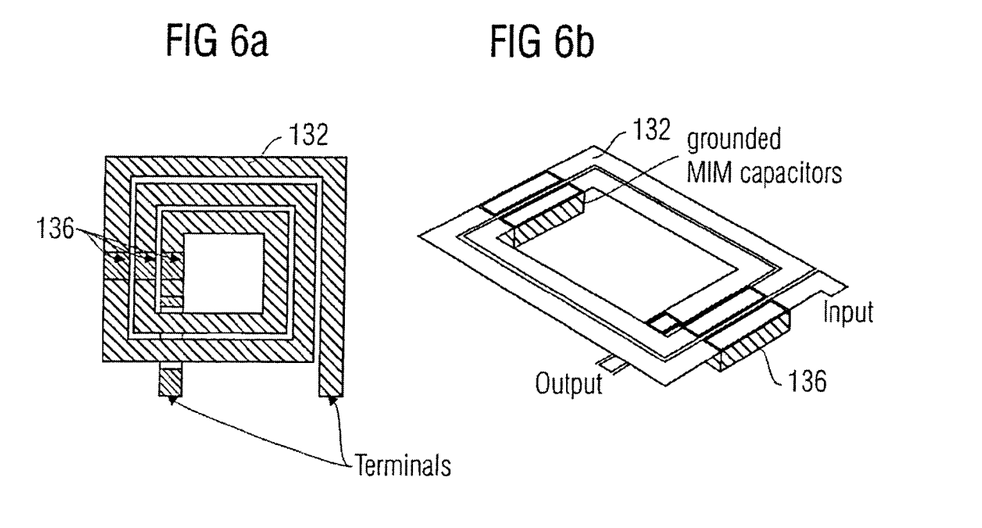

FIG. 6a shows a top view of an inductive conductive structure 132 configured in the form of a planar coil with capacitor structures 136 in the planar coil structure. Here, the capacitor structures 136 are connected between the ends or terminals of the inductive conductive structure 132 and a reference potential such as ground.

For clarification, FIG. 6b shows a perspective view of an inductive conductive structure 132 configured as a planar coil, comprising capacitor structures 136 formed below the planar coil and connected between the inductive conductive structure 132 and ground. Here, the inductive conductive structure 132 or a limited, predefined area of the inductive conductive structure 132 forms one electrode each of the capacitor structures 136, as has been described above.

The capacitor structures 136 may, as has previously been described, be configured for example as MIS capacitor structures, MIM capacitor structures or trench capacitor structures.

In a linear inductive conductive structure 132 having taps and capacitor structures 136 connected between the taps of the inductive conductive structure 132 and ground, the line sections between the taps show all but no inductive coupling among one other. In contrast to that, the structure shown in FIGS. 6a and 6b show a magnetic coupling of the coil windings, which are represented in a simplified manner in the equivalent circuit diagram in FIG. 6c.

Figure 6C:
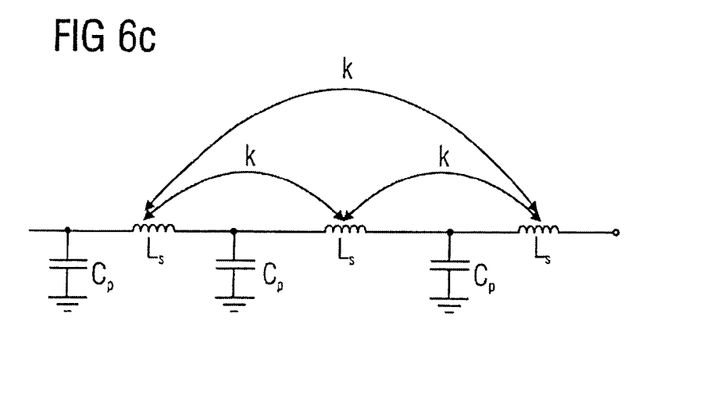
FIG. 6c is an equivalent circuit diagram of the assemblies shown in FIG. 6a and 6b.

Between the inductances $L_S$ of the line sections between the taps, there is a respective magnetic coupling k causing, in the end, an increase of an overall inductance but no further increase of the series resistance of the inductive conductive structure 132.

Figure 7:
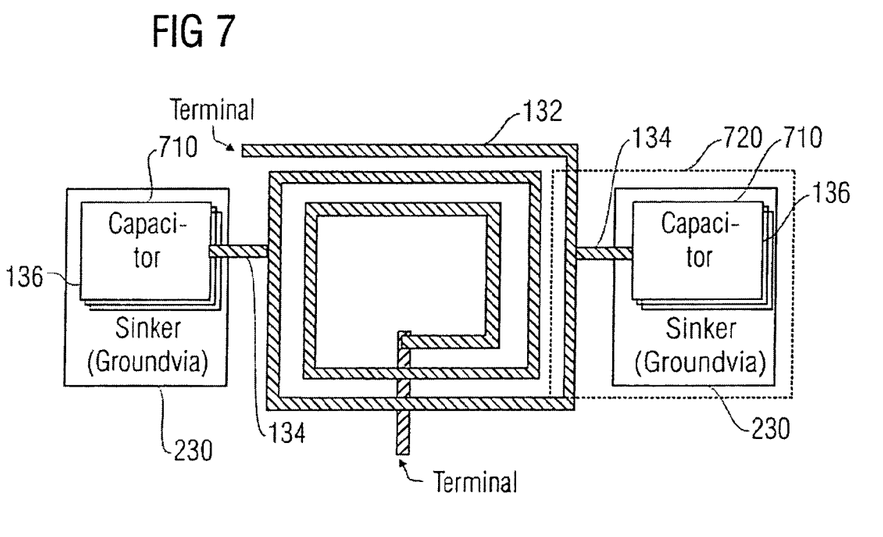
FIG. 7 is an inductive conductive structure wound up to form a planar coil with capacitor structures formed outside the planar coil and connected thereto according to an embodiment of the present invention.

A top view of a further embodiment of an integrated matching circuit with an inductive conductive structure 132 and a capacitor structure 136 is represented schematically in FIG. 7.

Compared to the assemblies shown in FIGS. 6a and 6b, here the capacitor structures 136 are formed via taps 134 outside the windings of the planar coil, so that they do not laterally overlap with the planar coil. A first electrode of the capacitor structures 136 is in turn formed via a metal area 710, which is patterned in the same metallization plane as the inductive conductive structures and/or the planar coil 132. In general, this will be a topmost metallization plane of an integrated circuit. A second electrode of the capacitor structures 136 is in turn formed via a sinker area 230 and possibly by further metallization layers located above, as has previously been explained in detail with respect to FIGS. 2 to 5.

The assembly shown in FIG. 7 is advantageous compared to the assembly shown in FIGS. 6a and 6b in that the quality of the planar coil formed by the inductive conductive structure 132 is not impaired due to the fact that the capacitor structures 136 have external terminals.

Figure 8:
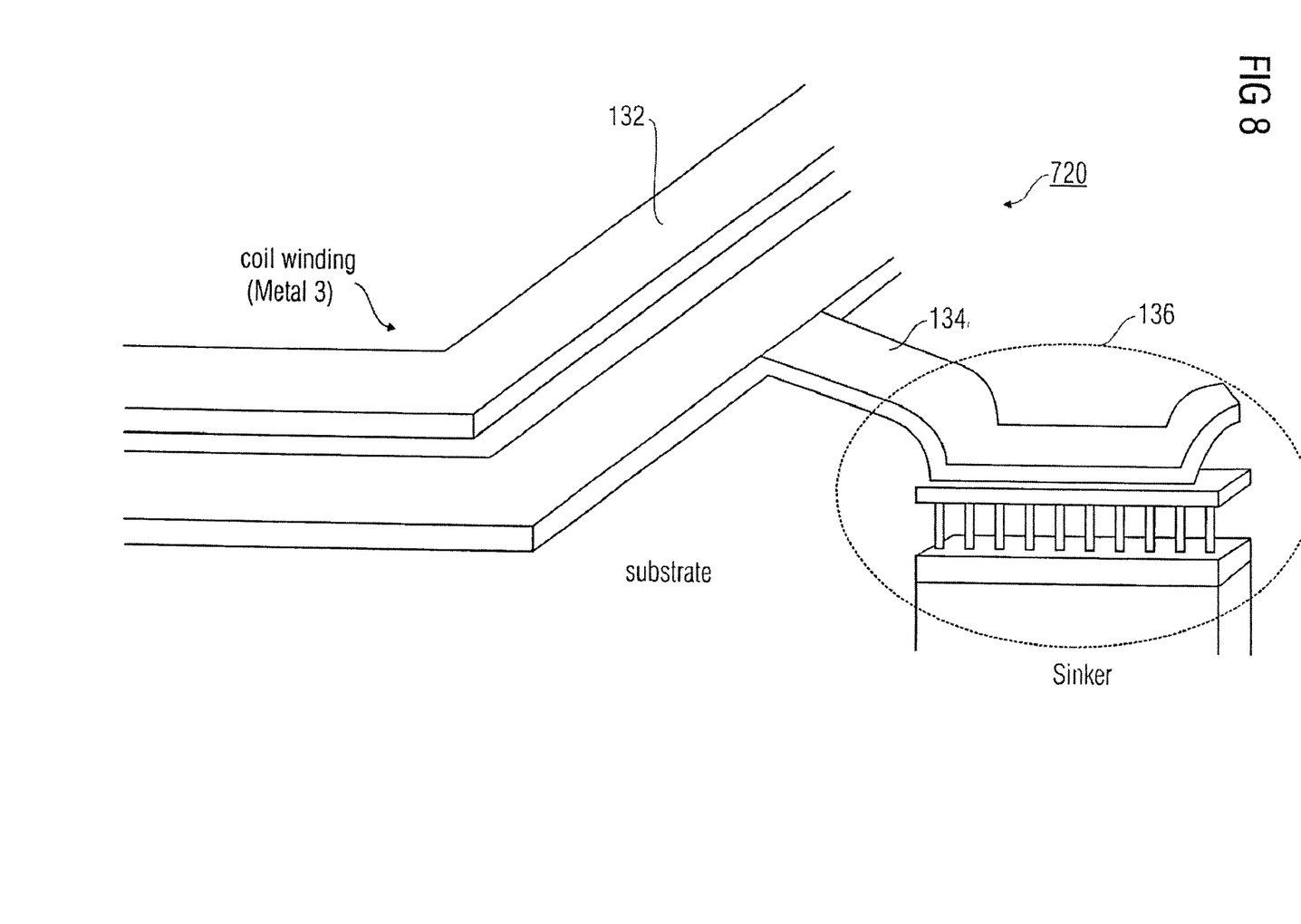
FIG. 8 is a perspective view of an enlarged section of FIG. 7.

A more detailed perspective view of the area shown in FIG. 7 and identified by reference numeral 720, is shown in FIG. 8.

In the embodiment exemplarily shown in FIG. 8, the capacitor structure 136 is configured as an MIM capacitor structure. As has previously been described, the capacitor structure 136 may also be configured as an MIS capacitor structure or as a trench capacitor structure between the metallization layer, in which the inductive conductive structure 132 is formed, and ground. The metallization layer, in which the conductive structure 132 and the taps 134 are patterned, is typically a topmost metallization layer of a layer stack of an integrated circuit.

A schematic top view of a further embodiment of the present invention is shown in FIG. 9a.

FIG. 9a shows a top view of an integrated matching circuit comprising at least two capacitor structures 136-1, 136-2 which are connected between the inductive conductive structure and a reference potential (for example ground) at taps 134-1, 134-2, wherein a third capacitor structure 136-3 is connected between the taps 134-1, 134-2 in parallel to the inductive conductive structure 132. The electrodes of the third capacitor structure 136-3 are also each connected to the taps 134-1, 134-2.

Figure 9B:
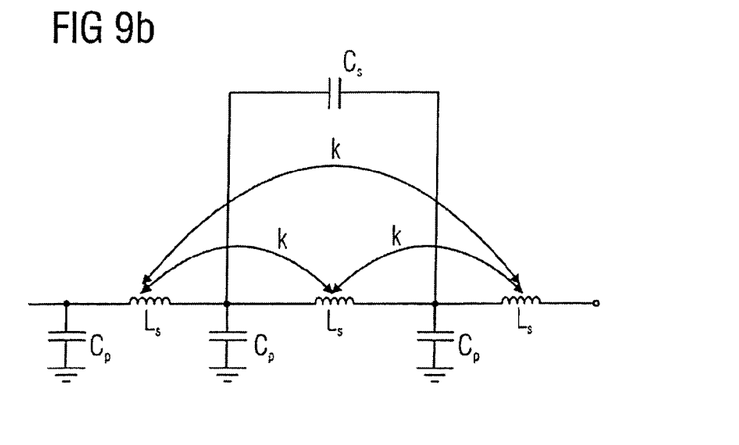

The equivalent circuit diagram of the integrated matching circuit shown in FIG. 9a is shown in FIG. 9b.

At the two taps 134-1, 134-2, a capacitor structure 136-1, 136-2 each, having a capacitance $C_P$, is connected between the inductive conductive structure 132 and ground. Between the two taps 134-1, 134-2 the capacitor structure 136-3 connected in parallel to the inductive conductive structure 132 has a capacitance $C_S$.

Inserting additional longitudinal capacitances $C_3$ in parallel to the conductive structure 132 serves to additionally bring the matching circuit in the vicinity of resonance by means of excitation, in order to utilize a further increase of the inductance just before the natural resonance of the matching circuit. Depending on the respective circuit application, thus a series or parallel resonance may be generated. As a result, a short circuit or open circuit behavior is generated, which may be utilized in order to insulate circuit parts for a certain frequency range from one another.

Matching circuits according to embodiments of the present invention may also be used for an efficiency increase with a harmonic impedance matching and for the stability enhancement of amplifiers by the use of a multi-stage collector low pass.

RF power amplifiers typically reach their maximum efficiency when an output matching with a transistor (for example an SiGe/GaAs-HBT, CMOS or LDMOS transistor) is correctly configured both for the operating frequency and/or fundamental wave of the transistor and for the harmonics of the operating frequency. In this, it is attempted to adjust the necessitated RF current by the transistor, using the real component of the fundamental-wave impedance of an output matching circuit and to compensate substrate capacitances and other parasitic elements by means of the imaginary component.

With mobile apparatuses having a low operating frequency U, (for example a 3.6 Volt Li ion cell) typically, a very low amplifier impedance R of an RF power amplifier is necessitated in order to achieve a specified power P. Here, the amplifier impedance R may be estimated via the term P=U2/2R. As maximum efficiency may not be achieved unless the power dissipation at the transistor, in particular of the collector/emitter stretch and/or between source and drain, is minimized, it follows from this, that the product of voltage U and current I at the transistor must be minimized. In order to avoid power loss, the result is that the voltage U and the current I should, if possible, not overlap at the transistor. This is prevented, among other things, by reactive components that are attempted to be compensated for by a mostly inductive component of the amplifier impedance. A further approach is the forming of the voltage and/or current curves by means of harmonic matching such that same are advantageously rendered rectangular, by which overlapping is reduced.

In impedance matching between successive amplifier stages, there is a limitation to the number of reactive elements. This results in the fact that for pre-amplifier stages, considering the harmonics is mostly dispensed with. Although this leads to a loss of efficiency, same is mostly dominated by the output stage. this procedure still has a potential for efficiency increase as, for example in GSM amplifiers, a driver stage in meanwhile able to reach the 1-watt class, and in addition the linearity may also be improved. In 3G systems, often large parts of the output stage are switched off in order to obtain lesser currents so that there no longer is any output stage dominance.

Figure 10:
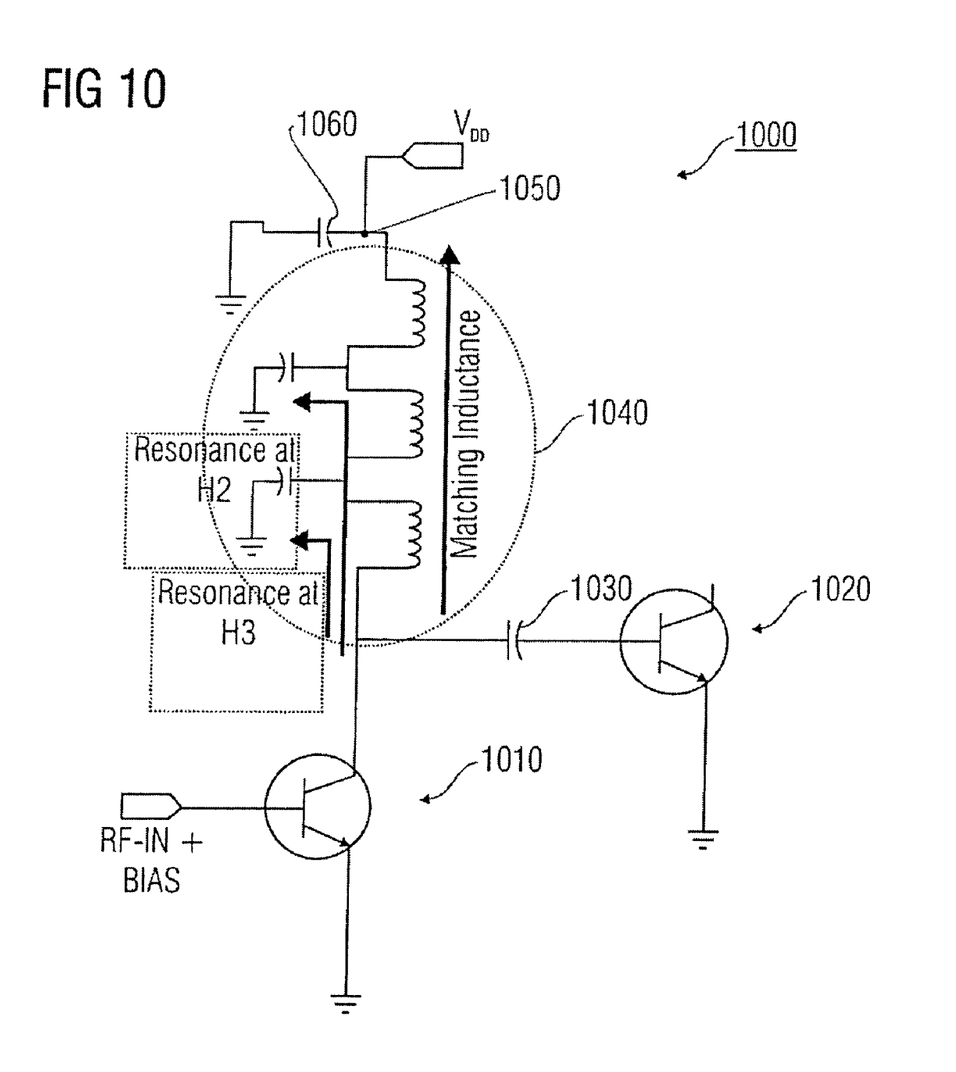
FIG. 10 is an amplifier circuit with a matching circuit according to embodiments of the present invention for the suppression of higher-order harmonics.

FIG. 10 schematically shows an amplifier circuit 1000 with a first transistor 1010 and a second transistor 1020, the base of the second transistor 1020 being connected to the collector terminal of the first transistor 1010 via a capacitance 1030. The emitter terminals of the two transistors 1010, 1020 are each connected to ground. Between the collector terminal of the first transistor 1010 and a supply potential $V_{DD}$, a matching circuit 1040 according to embodiments of the present invention is connected.

Between a node 1050 and ground, a capacitor 1060 is connected in order to block out DC portions.

The matching circuit 1040 may be realized as a planar coil with taps and capacitor structures 136, as it has been described with respect to FIGS. 6 to 8. The configuration represented in FIG. 10 is further advantageous in that a multi-stage low pass is created in the DC feed of the transistor 1010, so that oscillation tendencies are greatly reduced by a feedback via the supply $V_{DD}$. This serves to attenuate a radio frequency contamination of the current supply, whereby undesired spurious frequency conversion products (Spurii) are reduced.

In order to improve supply voltage suppression, a multi-stage low pass and/or a matching circuit 1040 may be used at a collector and/or a drain of a preamplifier transistor. In addition, proper choice of the capacitor structures 136 and the taps 134 serves to also co-influence a behavior of the harmonics of the operating frequency, by which efficiency and linearity of an amplifier may be increased.

Thus, by embodiments of the present invention, multi-stage integrated matching networks may be realized by installing capacitor structures in a layout structure of an inductance structure. Here, specifically semiconductor technologies with ground vias such as sinkers may be used in order to avoid parasitic inductances. Thereby, a multi-stage matching having advantages with respect to a necessitated integration area may be achieved, as now an inductive conductive structure, which may be wound up to form a planar coil, is used. Here also, the influence of a substrate not very RF suitable may be partially blocked out if there is a ground via (sinker). In addition, a magnetic coupling of windings of the inductive conductive structure may be utilized, which also serves to minimize a series resistance of the inductive conductive structure.

In conclusion, it is to be noted that the present invention is not limited to the implementations described herein or the procedure discussed, as these implementations and methods may vary. The terms used herein are not only destined for describing particular embodiments and are not used in any limiting sense. If in the description and in the claims the singular form or indefinite articles are used, same also refer to the plurality of these elements unless the overall content clearly states otherwise. Same counts vice versa.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An integrated circuit with a multi-stage matching circuit, comprising:
    an inductive conductive structure with a first end and a second end in the integrated circuit; and
    a capacitor structure in the integrated circuit being connected to a tap between the ends of the inductive conductive structure between the inductive conductive structure and a reference potential;
    wherein a first electrode of the capacitor structure is formed by a predefined area of the inductive conductive structure, and
    wherein a second electrode of the capacitor structure is connected to the reference potential through a low-resistance sinker extending through a semiconductor layer of the integrated circuit.

2. The integrated circuit according to claim 1, wherein the inductive conductive structure is patterned in a topmost metallization plane of the integrated circuit.

3. The integrated circuit according to claim 1, wherein a ratio of a smallest dimension of opposing areas of electrodes of the capacitor structure to a distance between opposing electrodes is greater than 50.

4. The integrated circuit according to claim 1, wherein the capacitor structure is formed by a metal insulator metal (MIM) capacitor structure, a metal insulator semiconductor MIS structure, or a trench capacitor structure.

5. The integrated circuit according to claim 1, wherein the capacitor structure comprises at least two capacitor structures, which at taps of the inductive conductive structure are connected between the inductive conductive structure and the reference potential, and wherein a third capacitor structure is connected between the taps in parallel with the inductive conductive structure.

6. The integrated circuit according to claim 1, further comprising a transistor, wherein one end of the inductive conductive structure of the matching circuit is connected to a drain terminal of the transistor and the other end of the inductive conductive structure is connected to a supply potential.

7. The integrated circuit according to claim 1, wherein the inductive conductive structure, the capacitor structure and the sinker are arranged on top of each other in the integrated circuit.

8. An integrated circuit with a multi-stage matching circuit, comprising:
   an inductive conductive structure patterned in a topmost metallization plane of the integrated circuit, with a first end and a second end in the integrated circuit; and
   a capacitor structure in the integrated circuit, wherein a first electrode is formed in the topmost metallization layer by a predefined area of the inductive conductive structure and wherein a second electrode is connected to a reference potential via a low-resistance region in a semiconductor substrate.

9. The integrated circuit according to claim 8, wherein a ratio of a smallest dimension of opposing areas of the first electrode and the second electrode of the capacitor structure to a distance between the opposing electrodes is greater than 50.

10. The integrated circuit according to claim 8, wherein the capacitor structure is formed by a metal insulator metal (MIM) capacitor structure, a metal insulator semiconductor (MIS) structure, or a trench capacitor structure.

11. The integrated circuit according to claim 8, comprising at least two capacitor structures which at taps of the inductive conductive structure are connected between the inductive conductive structure and the reference potential, and wherein a third capacitor structure is connected between the taps in parallel to the inductive conductive structure.

12. An integrated circuit with a multi-stage matching circuit, comprising:
   an inductive conductive structure formed as a planar coil in a topmost metallization plane of the integrated circuit, with a first end and a second end of the inductive conductive structure in the integrated circuit; and
   a capacitor structure in the integrated circuit formed outside the windings of the planar coil, so that the capacitor structure does not laterally overlap with the planar coil, wherein a first electrode of the capacitor structure is formed in the topmost metallization plane of the integrated circuit and is connected to a tap between the ends of the inductive conductive structure, and wherein a second electrode of the capacitor structure is connected to a reference potential via a low-resistance sinker extending through a semiconductor layer in the integrated circuit.

13. An integrated circuit, comprising:
   a supply potential terminal;
   a transistor with a drain terminal;
   an inductive conductive structure connected between the supply potential terminal and the drain terminal of the transistor; and
   a capacitor structure, connected to a tap between the supply potential terminal and the drain terminal of the transistor, between the inductive conductive structure and a reference potential;
   wherein a first electrode of the capacitor structure is formed by a predefined area of the inductive conductive structure, and
   wherein a second electrode of the capacitor structure is connected to the reference potential through a low-resistance sinker extending through a semiconductor layer of the integrated circuit.

14. A method for producing an integrated circuit with a multi-stage matching circuit, comprising:
   patterning an inductive conductive structure with a first end and a second end in the integrated circuit; and
   forming a capacitor structure in the integrated circuit between a tap of the inductive conductive structure and a reference potential;
   wherein a first electrode of the capacitor structure is formed by a predefined area of the inductive conductive structure, and
   wherein a second electrode is connected to the reference potential through a low-resistance sinker extending through a semiconductor layer of the integrated circuit.

15. The method according to claim 14, wherein the inductive conductive structure is patterned in a topmost metallization plane of the integrated circuit.

16. The method according to claim 14, wherein the capacitor structure is formed such that a ratio of a smallest dimension of opposing areas of electrodes of the capacitor structure to a distance between opposing electrodes of the capacitor structure is greater than 50.

17. The method according to claim 14, wherein the capacitor structure is formed by a metal insulator metal (MIM) capacitor structure, a metal insulator semiconductor (MIS) capacitor structure, or a trench capacitor structure.

18. The method according to claim 14, wherein the inductive conductive structure, the capacitor structure and the sinker are arranged on top of each other in the integrated circuit.

* * * * *